United States Patent
Matsumoto et al.

(10) Patent No.: US 7,056,414 B2
(45) Date of Patent: Jun. 6, 2006

(54) CONNECTING METHOD FOR METAL MATERIAL AND ELECTRIC CONDUCTIVE PLASTIC MATERIAL AND PRODUCT THEREBY

(75) Inventors: Akikazu Matsumoto, Toyota (JP); Tsuyoshi Tanigaki, Kariya (JP); Takami Noda, Nagoya (JP); Shogo Izawa, Tokai (JP)

(73) Assignee: Aisin Seiki Kabushiki Kaisha, Kariya (JP)

( * ) Notice: Subject to any disclaimer, the term of this patent is extended or adjusted under 35 U.S.C. 154(b) by 259 days.

(21) Appl. No.: 10/327,092

(22) Filed: Dec. 24, 2002

(65) Prior Publication Data

US 2003/0153223 A1    Aug. 14, 2003

Related U.S. Application Data (62) Division of application No. 09/684,818, filed on Oct. 10, 2000, now abandoned.

(30) Foreign Application Priority Data

Oct. 7, 1999    (JP)    ................................ 11-286916

(51) Int. Cl.
*B32B 37/00*    (2006.01)
(52) U.S. Cl. .................................... 156/308.2; 156/293
(58) Field of Classification Search ................ 156/73.1, 156/73.2, 73.6, 293, 273.9, 274.4, 274.6, 156/274.8, 308.2, 309.9
See application file for complete search history.

(56) References Cited

U.S. PATENT DOCUMENTS

| | | | |
|---|---|---|---|
| 4,028,798 A * | 6/1977 | Bechard et al. ................ 29/838 |
| 4,150,164 A * | 4/1979 | Gerek et al. ................. 427/447 |
| 4,574,019 A * | 3/1986 | Friedli et al. ............... 156/73.6 |
| 4,684,203 A | 8/1987 | Bihler | |
| 5,151,373 A * | 9/1992 | Deguchi et al. .......... 156/274.8 |
| 5,186,378 A * | 2/1993 | Alfaro ..................... 228/110.1 |
| 5,277,737 A * | 1/1994 | Li et al. ................... 156/274.8 |
| 5,944,538 A | 8/1999 | Sorig | |
| 6,072,115 A * | 6/2000 | Inoue et al. ................. 136/244 |
| 6,096,245 A | 8/2000 | Tanigaki et al. | |

FOREIGN PATENT DOCUMENTS

| | | | |
|---|---|---|---|
| JP | 10070127 A | * | 3/1998 |
| JP | 10-237315 A | | 9/1998 |

OTHER PUBLICATIONS

English abstract for JP 10070127.*

* cited by examiner

*Primary Examiner*—Jeff H. Aftergut
*Assistant Examiner*—John L. Goff
(74) *Attorney, Agent, or Firm*—Buchanan Ingersoll PC (57) ABSTRACT

A method for connecting a metal material with an electric conductive resin material including the steps of heating the connecting portion of the electric conductive resin material with the metal material to a temperature equal to or more than a softening point of the connecting portion and depressing the metal material to the heated portion for melting joint.

6 Claims, 7 Drawing Sheets

CONNECTING METHOD FOR METAL MATERIAL AND ELECTRIC CONDUCTIVE PLASTIC MATERIAL AND PRODUCT THEREBY

This application is a divisional of application Ser. No. 09/648,818, filed on Oct. 10, 2000 now abandoned.

This application is based on and claims priority under 35 U.S.C. § 119 with respect to Japanese Application No. 11(1999)-286916 filed on Oct. 7, 1999, the entire content of which is incorporated herein by reference.

FIELD OF THE INVENTION

This invention generally relates to a method of connecting a metal material and an electric conductive plastic material, and a product produced by such a method. More particularly, the present invention pertains to a method for connecting a metal material for a lead and an electric conductive plastic material for an electric circuit, and a product produced by such method.

BACKGROUND OF THE INVENTION

A known method for making a lead by connecting a metal and an electric conductive plastic is disclosed in a Japanese Patent Application published as Toku-Kai-Hei 10(1998)-237315 published in 1998. In this known method, the lead (made of metal material) is embedded in the electric circuit (made of electric conductive plastic material) at the same time the circuit is formed by injection molding.

Other known methods involve, for examples, connecting the lead to the electric conductive plastic material by soldering or using electric conductive adhesive agent (Ag system) and connecting the lead to the electric conductive plastic material by mechanically pushing the lead into the electric conductive plastic material.

However, these known methods have a variety of drawbacks and disadvantages. In the case of the method involving simultaneous connection during injection molding of the circuit, it is necessary for the electric components to be disposed in the mold at the injection molding. This can restrict the location or arrangement of the connecting formation and may result in increasing the complexity of the connecting process.

With the method involving pushing the lead into the circuit, the connection strength is relatively weak compared to the soldering method, thus possibly resulting in a separation of the connecting portion, especially of the electric connecting portion, due to vibrations and heat impact. as a result, the reliability of the connection cannot be ensured.

Further, to cope with environmental protection, non-lead or lead-free materials have been used for soldering. When using such lead free materials for soldering, the melting point of the lead-free materials tends to be higher when soldering and the electronic components may be destroyed due to the high temperature of the soldering process.

In light of the foregoing, a need exists for a method and product not as susceptible to the same disadvantages and drawbacks as those discussed above.

Thus, a need exists for a connecting method for connecting a metal material with an electric conductive plastic material, as well as a product produced by such a method. Further, a need exists for a method and product in which a metal material is reliably connected with an electric conductive plastic material.

SUMMARY OF THE INVENTION

One aspect of the present invention involves a method for connecting a metal material with an electrically conductive plastic material. The method includes heating the connecting portion between the metal material and the electrically conductive plastic material to a temperature equal to or more than a softening point of the electrically conductive plastic material and depressing the metal material to the heated portion by melting joint or by fusion.

Another aspect of the invention involves a method for connecting a metal lead to an electrically conductive plastic material. The method includes heating a portion of the electrically conductive plastic material to a temperature at least equal to a softening point of the electrically conductive plastic material, and pressing the metal material to the portion of the electrically conductive plastic material that has been heated to effect a mechanical connection between the metal lead and the electrically conductive plastic material as well as an electrical connection between the metal lead and the electrically conductive plastic material.

In accordance with the present invention, the metal material can be easily melted to the electric conductive plastic material by the softening of the plastic material with the heat at the connecting portion.

It should be noted here that the term "softening point" means in this specification the temperature at which the electric conductive plastic material is deformed by the depression of the metal material during the connecting process, and such temperature may be less than the temperature generally used as the point of starting deformation by softening the heated material.

The heating temperature at the connecting portion between the metal material and the electric conductive plastic material may be preferably over the melting temperature of the electric conductive plastic material so that a portion of the plastic material may be melted to be tightly connected to the metal material. During the depression of the metal material to the softened plastic material of the electrically conductive plastic material, a portion of the metal material may preferably press-fitted into the plastic material so that the contact area between the metal material and the plastic material is increased to achieve more tightened connection therebetween. It is also desirable to keep the temperature of conductive material at the interface between the metal and plastic materials greater than the temperature of the softening point of the electrically conductive material during the press-fitting process so that the press-fitting may be easily carried out. If the temperature is lower than the softening point, an excessive load may be required for press-fitting or it may lead to an incomplete connection to reduce the connecting strength or to increase the interface resistance at the connecting portion.

Further, the heating of the connecting portion between the metal and plastic materials may be carried out by applying electric current therebetween so that Joule heat is generated derived from the interface resistance to increase the temperature at the contacting portion of the electric conductive plastic material with the metal material to more than the softening point. This will make the deformation more easy during the depression of the metal to the plastic material. The generation of Joule heat occurs at the interface between the metal and plastic materials, and the contacting portion of the electrically conductive plastic material is heated to be partially softened. Accordingly, heating the electrically conductive plastic material at unnecessary portions (i.e., areas other than the contacting portion) can be avoided and this helps prevent the plastic material from deteriorating due to softening or heating.

In accordance with the connecting method of the present invention, heat is generated partially at the contacting portion of the metal and plastic materials so as not to heat the entire plastic material. With a small force, the metal material can thus be press-fitted into the plastic material.

One way of applying an electric current between the metal and plastic materials involves preferably applying the current by contacting the electrodes as close to the contacting portion as possible so that current may not be applied to unnecessary portions. The electric current for applying between the metal and electric conductive plastic materials may either be DC or AC. It is also preferable to provide any means for not to apply electric current to electronic parts, particularly when the metal material is a lead for electronic parts.

When the electric wire for the electronic parts is connected to a substrate type electrically conductive plastic material, the electrode can be arranged at a holding portion of a manipulator of a robot for the electronic parts to electrically and mechanically connect the electrode to the substrate of the electronic parts at the same time of arranging the electronic parts onto the substrate.

It is preferable to generally minimize the amount of applied current for effecting the connection to only allow the temperature at the connecting portion of the plastic material to exceed its softening point. This method can be attained by, for example, measuring the temperature of the contacting portion and using feed back control, or by preliminary setting the relationship between the current amount and the temperature at the connecting portion and applying the necessary current based on the preset relationship.

The heating of the connecting portion can also be made by generating friction heat through high speed vibration of the metal and plastic materials. The high speed vibration need not necessarily be a regulated one, but in order to increase the interface temperature, a high frequency wave is necessary to an extent. High speed vibration methods include an ultrasonic irradiation method or high speed vibration by mechanically holding at least one of the metal and the electrically conductive plastic materials. These heating methods are effective in connecting the metal to the surface of the plastic material.

The electrically conductive plastic material used in the present invention can be of different types, although it has been found preferable to have at least a portion made of thermoplastic resin. If the plastic material does not have such thermoplastic component, the plastic material may not be softened, or adequately softened, by heating the electrically conductive plastic material. It is still possible to use, for example, thermosetting resin material alone as long as the resin before setting by heating is capable of softening by heat.

It should be noted here that the term "thermoplastic resin material" in this specification includes a material or resin which has a plasticity temporarily softened by heating. In addition to materials softened by heating, such materials may include some thermosetting resins and are thus not limited to thermoplastic materials. Thus, in addition to generally known thermoplastic materials, some thermosetting resins that can be softened by heating before setting can be employed.

Electrically conductive plastic materials that may be used in the present invention include a macromolecule resin having electrical conductivity by itself, as well as a resin formed by combining a matrix resin and an electrically conductive material (filler or filler agent) which has electrical conductivity to form a net structure of electrically conductive material in the matrix resin. The matrix resin is not necessarily electrically conductive by itself, but a normal electric conductive thermoplastic resin can be used. As a filler, a metal or carbon black may be used. The filler should preferably be capable of being dispersed in the matrix resin and should possess a net structure mutually electrically connected within the resin, such as powder or fiber. Filler in the form of a powder is quite desirable as it improves the forming performance of the electric conductive plastic material. Filler in the form of fibers may generate anisotropy when the electrically conductive plastic material is formed by injection molding.

As a filler, metal is preferable. The use of a filler that includes low melting point metal or metal alloy has been found to be particularly useful. By using a low melting point metal material as a filler, the electrical connection is achieved by metallic bond between the filler and the metal material (e.g., the leads). This thus improves the electrical conductivity. It should be noted that the metal used as a filler also preferably includes high melting point metal such as copper to prevent separation of the filler and the matrix resin by the melting of all of the metal filler.

It is accordingly preferable to use a metal filler having a high melting point and a metal having a melting point which can be melted at a melting temperature of the matrix resin. Such metal may be a single metal of either high melting point or low melting point, or a composite of a single metal or metal alloy such as a copper and tin system alloy (Sn—Cu system alloy).

The filler agent forms a net structure in the matrix resin. The weight of the filler or filler agent may be chosen so that the net structure is capable of allowing the flow of necessary electric current.

According to the method of the present invention, the metal material can be mechanically connected to the matrix resin or the electrically conductive plastic material by melting together and also electrically connected by contacting the filler in the matrix resin or the electrically conductive plastic material.

It has also been found desirable to form a metal film on the surface of the metal material of the connecting portion. The melting point of such metal film is preferably lower than that of the metal material to be connected. The metal film is heated so as to be melted with the electrically conductive plastic material. It is preferable that the melting point of the metal forming the metal film be such that the metal film is softened or melted at the softening temperature of the electrically conductive plastic material. When forming such metal film on the metal surface, the electrically conductive plastic material should preferably be a resin composed of a low melting temperature metal filler and a matrix resin so that a rigid mechanical and electrical connection can be achieved by the mixture of the melting metal film and the melted metal filler. It is possible to form a metal film on the metal material at an area other than the connecting portion as long as such film forming does not interfere with the connecting method.

In accordance with another aspect of the invention, a product is produced in which the connection between a metal material and an electrically conductive plastic material is achieved by melting the thermoplastic material composing the electrically conductive plastic material. It is thus possible to achieve a reliable and high connection without using soldering materials by partially melting the thermoplastic material to be melted with the metal material. The electrical connection resulting the product according to the present invention can thus be produced easily and with a relatively simple procedure.

The composite product according to the present invention includes an electrically conductive plastic material having a matrix resin and a metal net structure formed in the matrix resin, including a low melting point metal and a metal material melted with the metal net structure. It is preferable to have a portion of the metal material embedded in the electrically conductive material to increase the connecting portion therebetween to improve the strength of the connection. As also noted above, a metal film, for example a tin plated metal, can be provided on the surface of the metal material, while the electrically conductive plastic metal may be composed of a polybutylene terephthalate resin portion and a Sn—Cu system metal alloy portion to connect the tin plated metal surface and the Sn—Cu metal alloy by melting.

BRIEF DESCRIPTION OF THE DRAWING FIGURES

The foregoing and additional features and characteristics of the present invention will become more apparent from the following detailed description considered with reference to the accompanying drawing figures in which like reference numerals designate like elements and wherein.

DETAILED DESCRIPTION OF THE INVENTION

Figure 1:
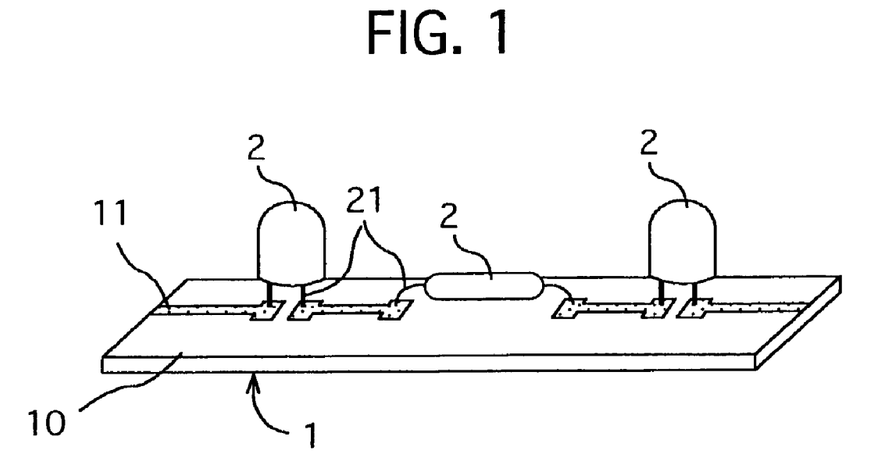
FIG. 1 is a perspective view of a case including electronic parts and an electric circuit formed according to the connecting method of the present invention.

Referring initially to FIG. 1, which illustrates electronic components attached to a substrate on which wires are arranged by an electrically conductive plastic material, the leads 21 or metal material of the electronic metal parts 2 are connected to wire portions 11 constituted by the electrically conductive plastic material and formed on a substrate of a case 1. As the materials used for effecting the connection between the metal material and the electrically conductive plastic material, any kind can be used in the context of the present invention, preferably as long as such are applicable to effecting a mechanical and electrical connection. The present invention may also be applied to any mechanical connection. Accordingly, the invention has application to any part such as a spacer which is to be connected mechanically on the substrate without also requiring electrical connection.

According to the present invention, an electrically conductive portion of the electrically conductive plastic material is partially heated to or beyond its softening point at the connecting portion to be connected to the lead or the metal material, and the lead is depressed onto the heated electrically conductive portion to connect the portion with the metal material through melting.

The lead is depressed on the softened electrically conductive portion to deform the softened electric conductive portion and thereby connect the two parts (i.e., the wire portion and the electrically conductive plastic portion). The heat is applied to a temperature that causes a part of the electrically conductive portion to be melted to assure a rigid connection between the materials.

When the lead is depressed on the electrically conductive portion, the lead should be press-fitted into the conductive portion to increase the area of contact and ensure a rigid connection between the lead and the electrically conductive portion.

The lead is preferably made of metal which may be copper, aluminum, gold, steel and metal alloys thereof. However, the lead may also be made of electrically conductive plastic material. If the lead is made of electrically conductive resin or plastic material, the connecting method of this invention may be applied to the connection between leads and the circuits. The shape of the leads is not limited, as the shape may include a wire or a plate.

It is preferable to provide a metal film on the metal material forming the lead. The film typically has a lower melting point than that of the metal material. By providing a metal film on the surface of the lead, the lower melting point film is melted in a way that rigidly connects the two materials, namely the melted film and electric conductive portion. This will enable the electrical connection to maintain a high electrical performance. Examples of materials for the film on the metal material include tin or tin alloys.

To form the film on the metal material, a conventional plating method may be used. A film having a thickness of 1 µm to 15 µm has been found to be useful, but the invention is not limited in that regard. In addition, it is to be recognized that the material used for making the film is not limited to the above mentioned low melting point metals, and can also include a metal such as Ni, Ag, Au or alloys of these metals.

According to this embodiment of the present invention, the electric circuit wire system on the substrate is formed as electrically conductive plastic material. The substrate is composed of an insulating portion 10 as shown in FIG. 1 that is made by electric insulated plastic material and an electrically conductive portion made by electrically conductive resin material.

To manufacture the substrate, co-injection molding or adhesion of each resin can be employed by way of example, although it is preferable to use co-injection molding due to the simplicity in forming any complex shape. It is also preferable to use low melting point resin for the co-injection molding. In this embodiment, the insulating portion is first formed followed by formation of the electric conductive portion. It is to be understood however that it may be possible to carry out the formation in the reverse order.

The patterns of the circuits on the substrate may be freely designed to supply electric power to the electronic parts. Also, the patterns of the circuits may be freely designed to connect various electronic parts that need to be connected together.

Figure 2A:
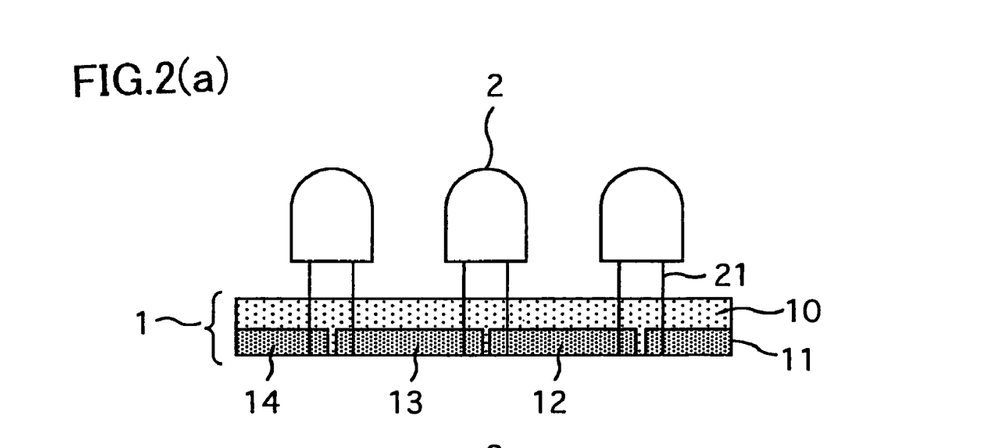
FIGS. 2(a)–(c) illustrates the details associated with a fixing method of connecting an LED and an electric conductive portion.

By co-injection molding, waste materials typically generated by conventional ways of making a substrate can be obviated or avoided. A first way of co-injection molding illustrated in FIG. 2(a) illustrates the electronic parts 2 being provided at one side of the insulating or insulative portion 10, with the circuit 11 being provided at the other side of the insulating portion 10. Another way illustrated in FIG. 2(b) involves both the electronic parts 2 and the circuit 11 being provided at one side of the insulating portion 10. A further alternative illustrated in FIG. 2(c) illustrates the circuit 11 being provided between insulating portions 10.

It is preferable to use the second portion for the wire system because of the easy installment of the electronic parts. It depends on, however, the position or the number of the electronic parts or other conditions.

When the third portion for the wire system is used, the lead should be inserted into the insulating portion to connect the lead with the electric conductive portion. In this case, a hole should be provided between the insulating portion and the electric conductive portion for easily contacting the two.

The insulating portion is made by the use of electric insulated resin material. Thus, the material to be used should have a good electric performance such as having a high volume resistance and anti-deterioration in age. The material should also possess low permittivity.

It is preferable for the co-injection molding, including the material, to have good injection molding performance. Examples of such insulating resin materials include the following: thermoplastic materials; polybutylene terephthalate (PBT), polyethylene terephthalate, polyphenylene sulfide, ABS resin, polystyrene, polyamide, polyacetals, poyetherimide, polyether-etherketone, polyethersulphone, polyethylene, polypropylene, polycarbonate, and copolymers thereof, and polymer alloy thermosetting plastic materials; urea resin, melamine resin, phenol resin and epoxy resin.

It is preferable for the substrate to use thermoplastic resin because the co-injection molding is then easy to carry out. PBT is the most preferable resin for this purpose. Due to the resembling characteristics of the melting viscosity, the circuit 11 and the insulating portion 10 can be formed uniformly and integrally.

The electrically conductive portion is made from electrically conductive resin material and is adapted to form the wire system that supplies power to the electronic parts. The electrically conductive resin for this purpose should thus preferably have a low volume resistance such as less than $10^{-2}$ Ω·cm or preferably less than $10^{-4}$ Ω·cm.

Possible materials for forming the electrically conductive resin material include an electrically conductive polymer which possesses electrical conductivity itself or a resin having the conductivity imparted to it by adding a certain amount of conductive material (filler) to the electrically insulated polymer (matrix resin) to form a three dimensional metal net structure in the filler. The latter resin is preferred because of the relative ease in injection molding or relatively easy availability.

As the matrix resin, it is preferable to use thermoplastic resin because of the ease in forming by co-injection molding. In this case, it is preferable to use a matrix resin having a high affinity between the filler and the electrically insulated resin used for the insulating portion. For example, PBT is preferable due to the melting temperature being close to the lower melting point metal alloy that is to be finely dispersed.

The type of filler to be dispersed in the matrix resin is not limited, as long as the filler possesses electrical conductivity. For example, metal, carbon black having electrical conductivity may be used. It is preferable that the filler be in the form of a powder or fiber, particularly a metal powder. The metal powder for the filler can include high melting point metal such as copper, although it may be more preferable to include a low melting point metal alloy, such as an Sn—Cu system alloy, or Sn—Pb system alloy. From an environmental standpoint, the Sn—Cu system alloy may be more preferable. It is also possible to use a low melting point metal alone as the metal powder filler.

The rate of mixture of the filler and the matrix resin should be controlled to reduce the volume resistance of the generated electrically conductive resin.

The amount of the filler should be relatively small because the more filler, the less mechanical performance of the generated resin. As an example, the Sn—Cu—Ni—P alloy of 50 weight % to 95 weight % can be added to the PBT.

Adding the filler to the matrix resin can be carried out by sufficiently mixing the matrix resin (thermoplastic resin) and the filler, and if necessary dispersing agent, under heating to make a pellet. If the matrix resin is made of thermosetting resin, a dispersing agent should be used to sufficiently disperse the filler into the thermosetting resin before setting.

To heat the contacting portion that is to be connected with the electrically conductive portion, one method involves direct heating at the conductive portion, while another method involves indirectly heating the connecting portion by heating through the lead. With indirect heating through the lead, the connecting portion necessary for heating (the portion of the conductive portion that contacts the lead) can be selectively heated.

Direct heating can preferably be performed by heating with a heating source (e.g., a soft beam such as xenon or hot air). Before contacting the lead with the conductive portion or during the contacting of the lead with the conductive portion, the lead is heated at a surface near the connecting portion between the lead and the conductive portion. A radiator or heat sink may be used to avoid unwanted damage of the electronic parts when the electronic parts are not heat resistant. This will be generally the same as the indirect heating process.

Another method for heating is to apply electric current between the lead and the electric conductive portion at the connecting portion or to apply high speed vibration between the lead and the conductive portion.

To apply current between the lead and the electric conductive portion at the connecting portion, the lead and the conductive portion can be contacted with electrodes while applying current therebetween to use Joule heat generated by the interface resistance between the lead and the conductive portion. The heat generated portion is the contacting portion of the lead and the conductive portion, and only the metal and its surrounding area of the electrically conductive portion are influenced by the generated heat.

To control the amount of heat at the interface, the amount of applied current can be controlled by the electric power source. Any conventional power source may be used, for example a condenser type, an AC type or an inverter type. However, the inverter type is preferred due to its relative ease of control. To supply electric power to the interface, this can be accomplished by contacting a fixed electrode with the conductive portion 11 on the substrate and by holding the lead 21 by the other electrode. The other electrode may be provided on the arm of, for example, a parts feeding robot.

With respect to the high speed vibration method, friction heat can be generated between the lead and the conductive portion, with such friction heat being used for effecting heating between the lead and the conductive portion at the connecting portion. The friction heat is only generated around the metal material of the conductive portion and this may thus be a preferable method to use. The high speed vibration may be carried out by ultra-sonic wave or mechanical vibration by holding the lead or the conductive portion.

The composite product produced by the above-described connecting of the metal and electrically conductive plastic material will be explained with reference to FIG. 1. As shown In FIG. 1, electronic components are attached to a substrate on which wires are arranged by virtue of the electrically conductive plastic material.

The electronic metal parts 2 include leads 21. These leads 21 of the electronic metal parts 2 are connected to wire portions 11 constituted by the electrically conductive plastic material and formed on the substrate of the case 1. The materials used for connecting the metal and electrically conductive plastic can be of various kinds as long as such materials are preferably applicable to effecting mechanical and electrical connection. It is also applicable to the materials such as spacers which should be connected mechanically on the substrate without any electrical connection.

The product made by the above-described connecting method includes a lead made of metal material and an electrically conductive plastic material having an electrically conductive portion made of thermoplastic resin. The connection of the metal material and the electrically conductive plastic material is made by melting the electrically conductive portion. The materials used for the lead, the electrically conductive portion and the substrate are the same materials as those already explained above.

According to the present invention, both the lead and the electrically conductive plastic portion are contacted without any gap therebetween so that the lead is connected to the conductive portion electrically. The connecting area of the present invention may be larger than the connecting area produced by a mechanical connection such as press-fitting. The mechanical strength and the electrical conductivity of the connection produced in accordance with the present invention are superior to that produced from a mechanical connection. It is preferable in the context of the present invention to embed a portion of the lead in the electrically conductive portion for ensuring the desired connection strength.

A product produced in accordance with the present invention will be explained in more detail below according to several embodiments of the invention.

EMBODIMENT 1

Figure 3A:
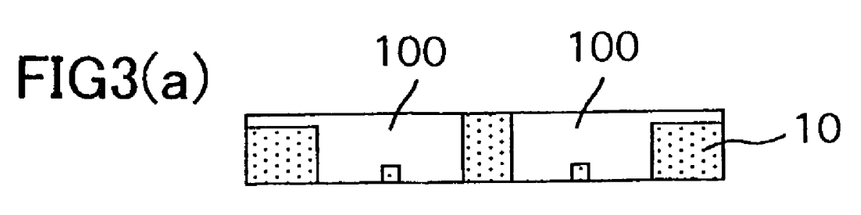
FIGS. 3(a)–(b) are schematic illustrations of a procedure for co-injection molding of the case.
Figure 3B:
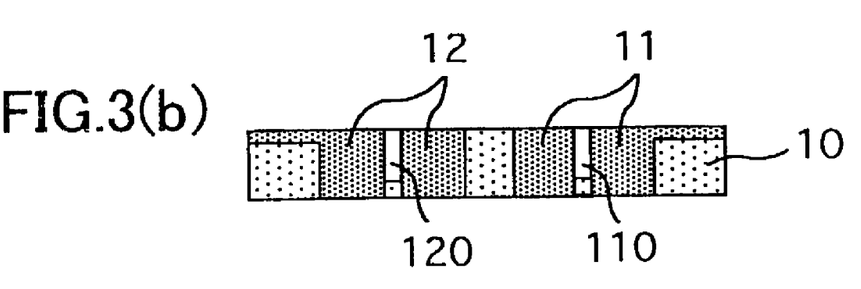

The case body 10 to be used as the insulating portion was formed from insulated thermoplastic resin (PBT resin) as shown in FIG. 3a by injection molding, with the resulting case body 10 including a space(s) 100. After formation of the case body 10, the case body was again disposed in a die and an electrically conductive resin (Sn—Cu system alloy: 90 weight %; PBT resin: 10 weight %) was injected into the space 100 to form circuits (thickness: 3 mm) by the electrically conductive portions 11, 12 as shown in FIG. 3(b). The combination of the insulative portion 10 and the electrically conductive portions 11, 12 form the case 1 as shown in FIG. 4.

Figure 4:
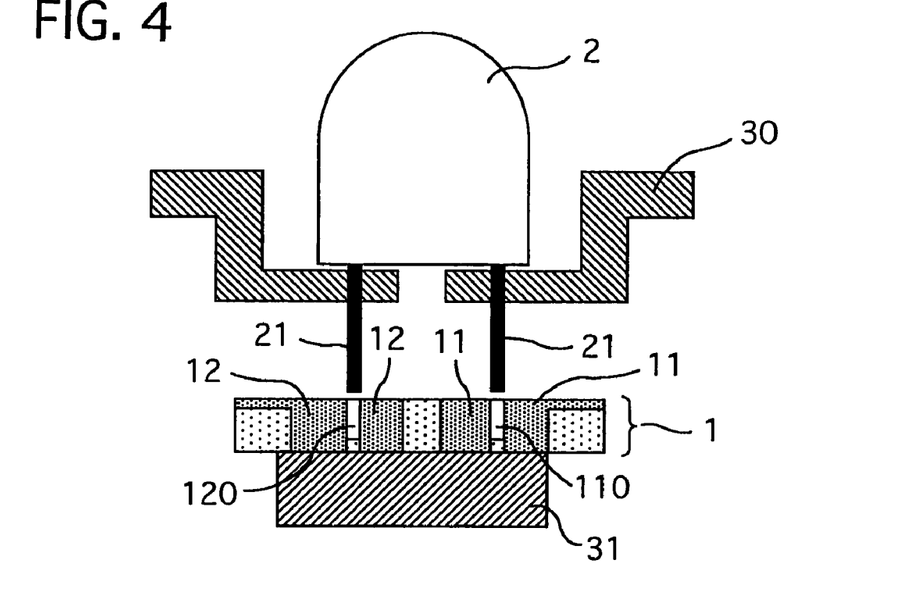
FIG. 4 is a cross-sectional view of an electrically conductive plastic material and a metal material illustrating a connecting method in accordance with the present invention.

In the electrically conductive portions 11, 12, several connecting holes 110, 120 (diameter: 0.4; depth: 2 mm) were formed during the injection molding for receiving the connecting leads 21 (diameter: 0.5 mm) of light-emitting diodes (LED) 2 as shown in FIG. 4. The leads 21 of the LED 2 are made of phosphorus bronze and are tin-plated on their surface.

The connection between the circuits 11, 12 and the leads 21 was performed in the manner shown in FIG. 4. The leads 21 and the reverse side of the electric conductive circuits 11, 12 were contacted with electrodes 30, 31, respectively. The electrode 30 is made of copper alloy and holds the leads 21 to thereby hold the LED. The electrode 31 is also made of copper alloy. Each lead 21 was inserted into a respective hole 110, 120 between the electrodes 30, 31, with a load of 9.8 N (1 Kgf) being applied in the inserting direction. A current of 400 A was applied for 0.1 seconds by an inverter controlled DC resistor welding machine (manufactured by Matsushita). The interface between the circuits 11, 12 and the leads 21 was thus melted, cooled, and set. The leads 21 were embedded in the circuits 11, 12 with a depth of 2 mm. The thus connected and composed product was tested as the embodiment 1 sample.

A heat impact test was then conducted on the embodiment 1 sample. The connected portion of the leads and the circuits were cut and taken out from the case 1 and left for a certain time in the heat impact furnace. Then the contact resistance between the leads and the circuits was measured under the conditions that the time for rising and falling temperature between $-30°$ C. and $120°$ C. was five (5) minutes and the holding time for holding between $-30°$ C. and $120°$ C. was thirty (30) minutes. After taking out the connecting portion, it was observed by a metal microscope.

EMBODIMENT 2

In this embodiment, the case 1 was formed by co-injection molding, with the circuits 11, 12 being formed on the case 1. The LED 2 includes leads 21 made of phosphorus bronze that was nickel-plated on its surface. The connection between the leads 21 and the circuits 11, 12 was made by the same method as that used in the first embodiment. The interface between the circuits 11, 12 and the leads 21 was melted, cooled, and set. Finally, the leads 21 were embedded in the circuits 11, 12 with a depth of 2 mm. The thus connected and composed product was tested using the same heat impact test described above, thus constituting the embodiment 2 sample.

EMBODIMENT 3

In this third embodiment, the case 1 was formed by co-injection molding in the same way as the second embodiment, with the circuits 11, 12 being formed on the case 1. The LED 2 includes leads 21 made of phosphorus bronze, with the surface of the leads 21 being silver-plated.

The interface between the circuits 11, 12 and the leads 21 was melted, cooled, and set. Finally, the leads 21 were embedded in the circuits 11, 12 with a depth of 2 mm. The thus connected and composed product was tested by the heat impact test described above, forming the embodiment 3 sample.

EMBODIMENT 4

In this fourth embodiment, the case 1 was formed by co-injection molding in the same manner as in the first embodiment. An LED 2 similar to that used in the first embodiment was also employed.

Figure 5:
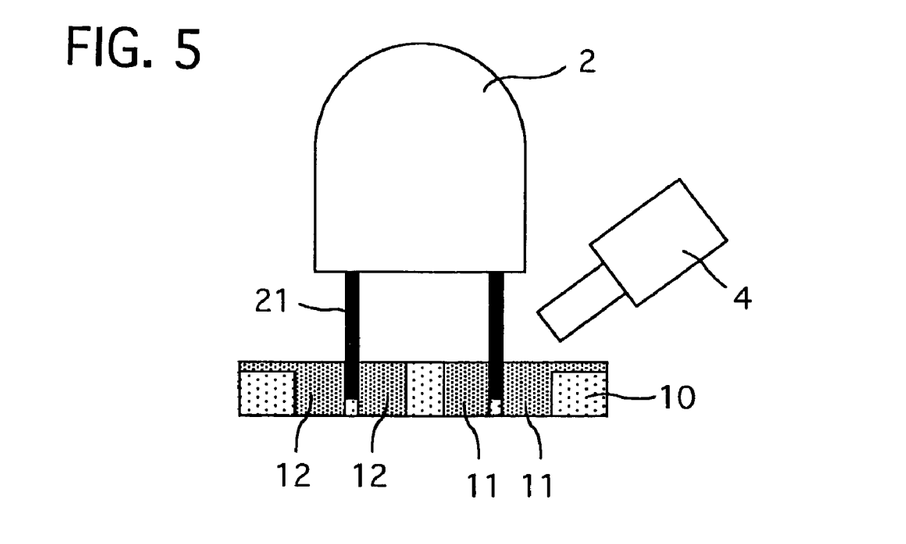
FIG. 5 is a cross-sectional view of an electrically conductive plastic material and a metal material illustrating another connecting method in accordance with the present invention.

The leads 21 and the holes 110, 120 were heated by hot air as shown in FIG. 5 using a heated air fan 4 and with a temperature of 200° C. Each lead 21 was inserted into a respective hole 110, 120 with a load of 9.8 N (1 Kgf) under the heated condition. The interface between the circuits 11, 12 and the leads 21 was melted, cooled, and set. Finally, the leads 21 were embedded in the circuits 11, 12 with a depth of 2 mm. The thus connected and composed product was tested by the heat impact test described above, thus forming the embodiment 4 sample.

EMBODIMENT 5

In this fifth embodiment, the case 1 was formed by co-injection molding in the same manner as the first embodiment. Also, an LED 2 similar to that used in embodiment 1 was employed.

Figure 6:
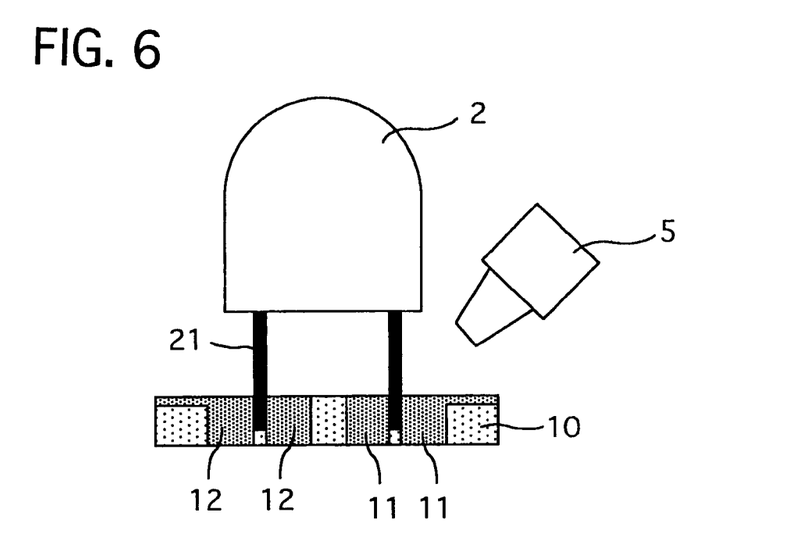
FIG. 6 is a cross-sectional view of an electrically conductive plastic material and a metal material illustrating another connecting method in accordance with the present invention.

The leads 21 and the holes 110, 120 were heated by an xenon light irradiation device 5 as shown in FIG. 6 by irradiating with a soft beam (xenon light). Each lead 21 was inserted into a respective hole 110, 120 with a load of 9.8 N (1 Kgf) under the irradiated condition. The interface between the circuits 11, 12 and the leads 21 was melted, cooled, and set. Finally, the leads 21 were embedded in the circuits 11, 12 with a depth of 2 mm. The thus connected and composed product constituting the embodiment 5 sample was tested using the heat impact test described above.

EMBODIMENT 6

In this sixth embodiment, the case 1 was formed by co-injection molding as described above with the first embodiment. Also, an LED 2 similar to that used in the first embodiment was employed.

Figure 7:
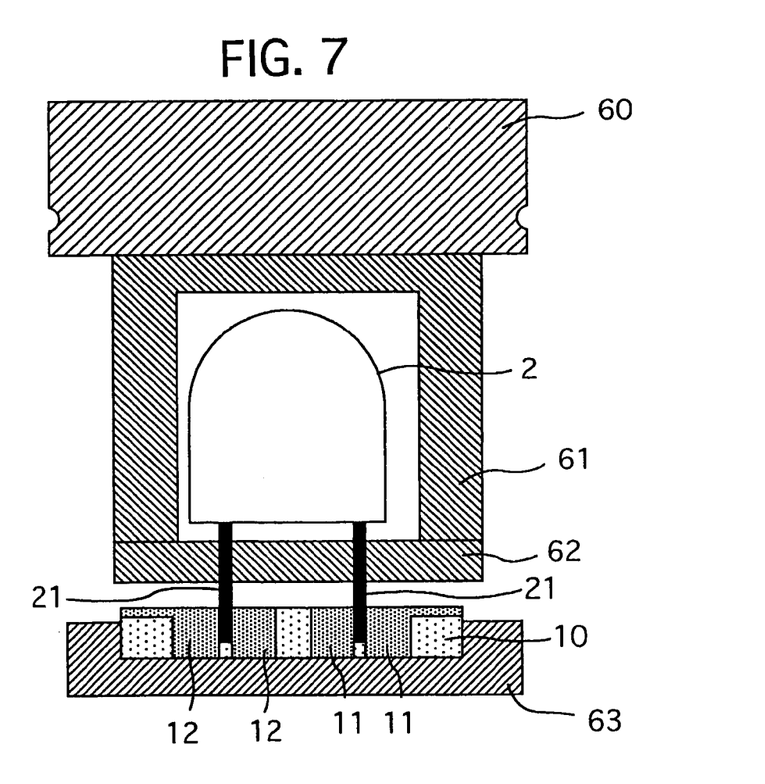
FIG. 7 is a cross-sectional view of an electrically conductive plastic material and a metal material illustrating a further connecting method in accordance with the present invention.

As shown in FIG. 7, each lead 21 was pressed into a respective hole 110, 120 with a load of 9.8 N (1 Kgf) by holding the LED and leads 21 with jigs 61, 62. While pressing the leads, an ultrasonic wave (120,000 Hz for 1 second) generated by an ultrasonic wave horn 60 was directed at the interface between the leads 21 and the circuits 11, 12 through the jigs 61, 62. The interface between the circuits 11, 12 and the leads 21 was melted, cooled, and set. Finally, the leads were embedded in the circuits 11, 12 at a depth of 2 mm. The thus connected and composed product constituting embodiment sample 6 was tested by the heat impact test described above.

EMBODIMENT 7

In this seventh embodiment, the case 1 was formed by co-injection molding as described in connection with the first embodiment. In this embodiment, however, no holes for the leads were provided. An LED 2 similar to that used in the first embodiment was employed.

Figure 8:
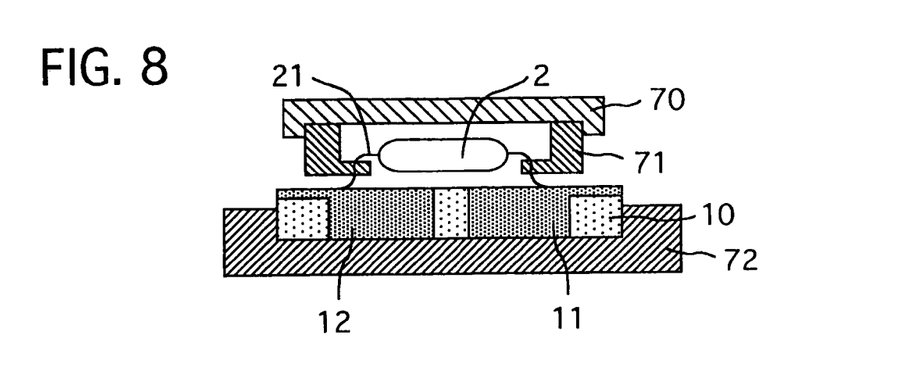
FIG. 8 is a cross-sectional view of an electrically conductive plastic material and a metal material illustrating a still further connecting method in accordance with the present invention.

Each lead 21 was pressed on the circuits 11, 12 with a load of 9.8 N (1 Kgf). As shown in FIG. 8, while pressing the leads, a high speed vibration (240 Hz for 1.5 seconds) was applied in the horizontal direction by the jigs 70, 71. The interface between the circuits 11, 12 and the leads 21 was melted, cooled, and set, with the thus connected and composed product forming embodiment sample 7 being tested by the heat impact test described above.

For comparative purposes, the above sample embodiments were compared several comparative examples formed in the following manner.

COMPARATIVE EXAMPLE 1

Figure 2B:
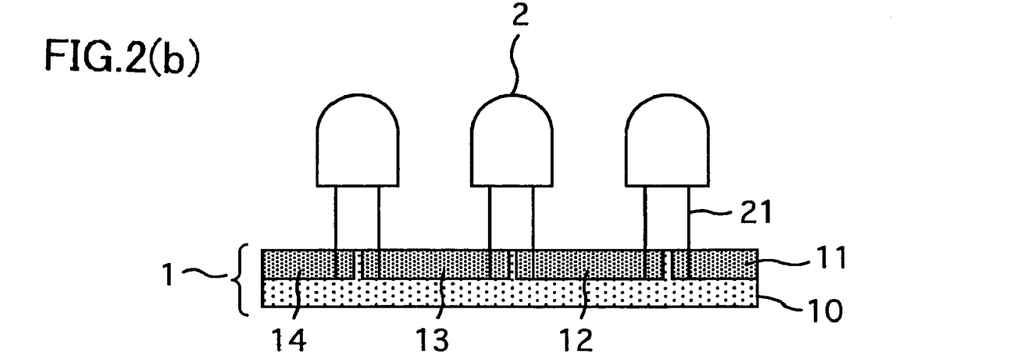
Figure 2C:
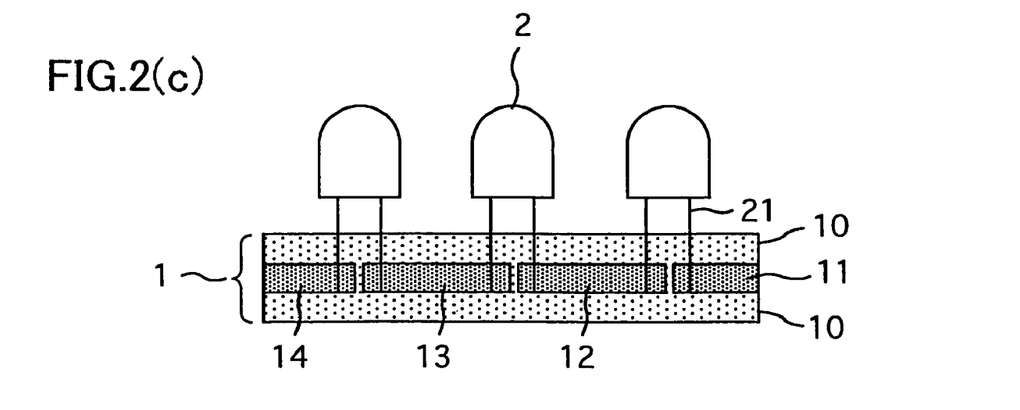

The case body 10 as an insulated portion was formed as shown in FIG. 2 with insulated PBT resin. The case 10 was again disposed in a die and an electric conductive resin (PBT resin: 70 weight %; carbon fiber: 30 weight %) was injected into the space 100 to form circuits as electrically conductive portions 11, 12. The case 1 was thus constituted by the insulative portion 10 and the electrically conductive portions 11, 12.

In the electrically conductive portions 11, 12, connecting holes 110, 120 were formed for connecting the leads 21 of light-emitting diodes (LED) as in the case of embodiment 1 described above. The same LED 2 used in embodiment 1 was used here.

Each lead 21 was pressed with the load of 19.6 N (2 Kgf) to be fitted into a depth of 2 mm. Thus connected and composed product was tested by the heat impact test as a sample of the comparative example 1 similar to the embodiment 1.

COMPARATIVE EXAMPLE 2

The case body 10 as an insulated portion was formed as shown in FIG. 2 using insulated PBT resin. The case body 10 was again disposed in a die and an electric conductive resin (PBT resin: 50 weight %; copper fiber: 50 weight %) was injected into the space 100 to form circuits as electrically conductive portions 11, 12. The case 1 was thus constituted by the insulative portions 10 and the electrically conductive portions 11, 12.

In the electric conductive portions 11, 12, connecting holes 110, 120 were formed for connecting the leads 21 of light-emitting diodes (LED) as in embodiment 1. In addition, the same LED 2 as that used in embodiment 1 was used here.

Each lead 21 was pressed with a load of 19.6 N (2 Kgf) and fitted to a depth of 2 mm into one of the holes. The thus connected and composed product constituting comparative example 2 was tested using the heat impact test as in embodiment 1.

COMPARATIVE EXAMPLE 3

In this third comparative example, the case 1 was formed by co-injection molding as in the first embodiment. However, in this embodiment, no holes for the leads were provided. An LED similar to the LED used in embodiment 1 was employed.

Each lead 21 was pressed on the circuits 11, 12 with a load of 19.6 N (2 Kgf) so as to be fitted to a depth of 2 mm. After pressing, the thus connected and composed product constituting comparative example sample 3 was tested by a heat impact test.

COMPARATIVE EXAMPLE 4

Figure 9A:
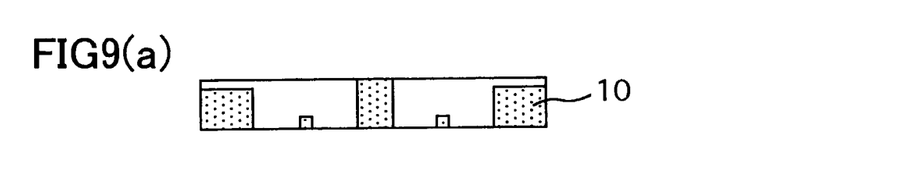
FIGS. 9(a)–(c) are cross-sectional views of an electrically conductive plastic material and a metal material illustrating a connecting method in accordance with several comparative examples.
Figure 9B:
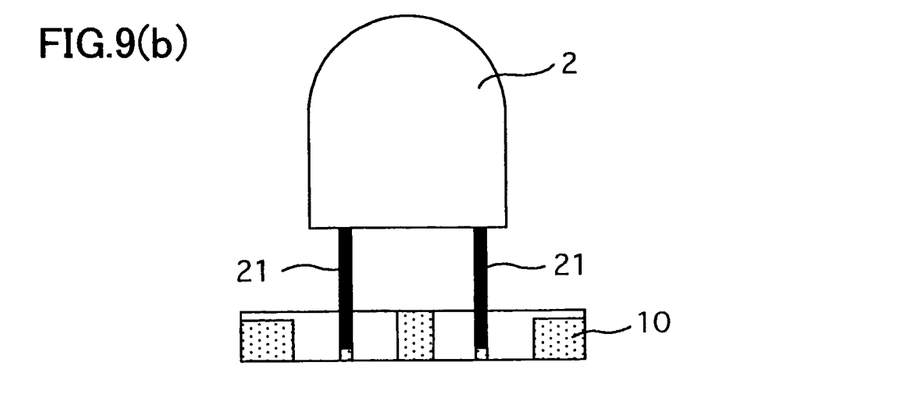
Figure 9C:
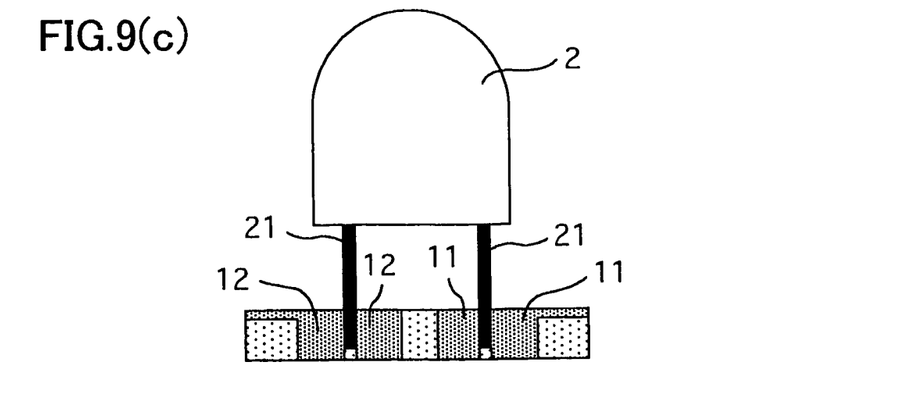

In this fourth comparative example, the case body 10 as an insulated portion was formed as shown in FIGS. 9(a)–(c) by injection molding using insulated PBT resin. The case body 10 was disposed in a die and an electric conductive resin (Sn—Cu system alloy: 90 weight %; PBT resin: 10 weight %) was injected to form circuits as electrically conductive portions 11, 12. The LED 2 was disposed in the die before injection and the connection of the leads 21 of the LED 2 and the circuits 11, 12 was made at the time of injection. The LED used in this example was the same as that used in embodiment 1. Also, each lead 21 was connected with the circuits 11, 12 at a connecting depth of 2 mm. The thus connected and composed product constituting comparative example sample 4 was tested by the heat impact test.

COMPARATIVE EXAMPLE 5

In this fifth comparative example, and as shown in FIG. 9(a), the case body 10 was formed by the injection molding insulated thermoplastic resin (PBT). The case body 10 was inserted in a die to form the circuits 11, 12 by injecting electrically conductive plastic material (Sn—Cu system alloy: 90 weight %; PBT resin: 10 weight %). The LED 2 was disposed in the die before injection and the connection of the leads 21 of the LED 2 and the circuits 11, 12 was made at the same time as injection. The LED 2 used in this example was the same as in embodiment 2. Also, each lead 21 was connected with the circuits 11, 12 at a connecting depth of 2 mm. The thus connected and composed product constituting comparative example sample 5 was tested by the heat impact test.

COMPARATIVE EXAMPLE 6

In this sixth comparative example, the case body 10 was formed by the injection of insulated thermoplastic resin (PBT) as shown in FIG. 9(a). The case body 10 was inserted in a die to form circuits 11, 12 by injecting electrically conductive plastic material (Sn—Cu system alloy: 90 weight %; PBT resin: 10 weight %). The LED 2 was disposed in the die before injection and the connection of the leads 21 of the LED 2 and the circuits 11, 12 was made at the time of injection. The LED 2 used in this example was the same as that used in embodiment 3. Each lead 21 was connected with the circuits 11, 12 at a connecting depth of 2 mm. The thus connected and composed product constituting comparative example sample 6 was tested by the heat impact test.

RESULTS

The results of the heat test for the above embodiments and examples are listed in the following table.

TABLE 1

| | Initial Value | 200 H (Hours) | 500 H | 1000 H | 1500 H | 2000 H |
|---|---|---|---|---|---|---|
| Embodiment 1 | 1.0 | 1.1 | 1.2 | 1.3 | 1.4 | 1.4 |
| Embodiment 2 | 1.4 | 1.6 | 1.6 | 1.7 | 1.9 | 1.9 |
| Embodiment 3 | 0.5 | 0.7 | 0.9 | 1.1 | 1.1 | 1.1 |
| Embodiment 4 | 1.8 | 1.9 | 2.0 | 2.2 | 2.6 | 2.6 |
| Embodiment 5 | 1.7 | 1.8 | 1.9 | 2.0 | 2.4 | 2.4 |
| Embodiment 6 | 2.0 | 2.1 | 2.1 | 2.3 | 2.4 | 2.5 |
| Embodiment 7 | 2.0 | 2.2 | 2.3 | 2.4 | 2.5 | 2.5 |
| Comparative 1 | 2000 | 2050 | 2250 | 2620 | 2850 | 3230 |
| Comparative 2 | 150 | 440 | 1110 | 1180 | 1210 | 1270 |
| Comparative 3 | 20 | 200 | 400 | 600 | 850 | 970 |
| Comparative 4 | 1.3 | 1.4 | 1.5 | 1.7 | 2.0 | 2.2 |
| Comparative 5 | 12 | 65 | 87 | 120 | 146 | 172 |
| Comparative 6 | 3.0 | 37 | 75 | 80 | 82 | 96 |

Comparing the results of the comparative examples versus the examples produced according to the present invention reveals that the connecting portion of the various embodiments of the product according to the present invention have superior heat impact resistance and high reliability of the electric connection.

Figure 10:
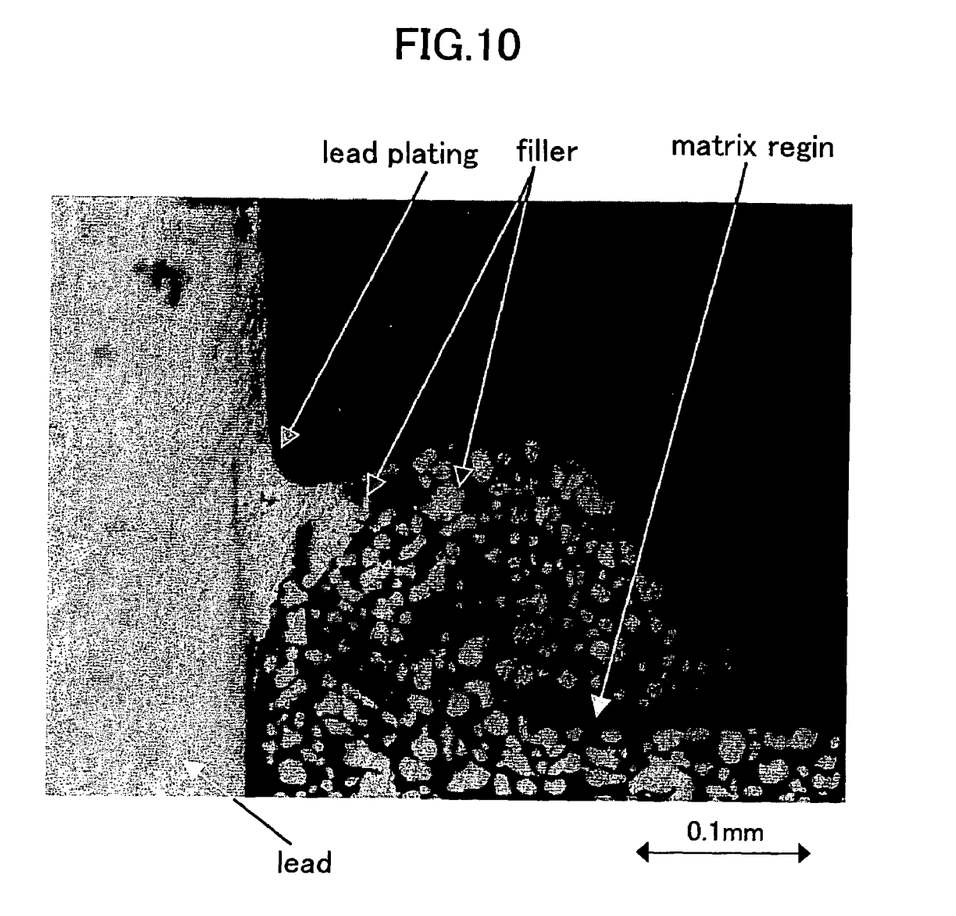
FIG. 10 is a cross-sectional view of the composite product produced in accordance with the present invention.

FIG. 10 illustrates the product produced as embodiment 1. This illustration shows that the electrically and mechanically strong connection between the leads and the electrically conductive resin was achieved by the melting and mixing of the portion of metal powder of the electric conductive resin and the surface of the leads.

The matrix resin of the electrically conductive resin was melted to be in close contact with the surface of the leads substantially without any gap therebetween.

STRENGTH OF CONNECTION

Test: all of the above embodiments and the comparative examples were tested by pulling out the connecting portion by pliers for the purpose of strength test. The results of the test establish that a strong pulling force was necessary for the embodiment samples 1–7 and confirmed the fixation of the resin at the connecting portion of the leads. Also, the electrically conductive resin forming the circuit 11 was confirmed to have damaged portions.

Considering comparative example samples 1–6, it was easier to pull out the leads as compared to embodiment samples 1–7 and fixing occurred at the leads forming portions. Further, the interface of the electrically conductive resin forming the circuit 11 and the leads was confirmed to have peeling-off or parting.

The principles, preferred embodiments and modes of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A method for connecting a metal material with an electrically conductive resin material at a connecting portion comprising;

heating the connecting portion of the electrically conductive resin material and the metal material to a temperature equal to or greater than a softening point of the connecting portion;

wherein the electrically conductive resin material is comprised of a matrix resin and a net metal structure;

wherein the metal material is plated with a metal including tin, the electrically conductive resin material is made of polybutylene terephthalate and the metal structure is made of Sn—Cu alloy; and pressing the metal material to the electrically conductive resin material to effect a melting joint, wherein the electrically conductive material and the metal material are mutually melted at the connecting portion to connect the electrically conductive material with the metal material.

2. The method according to claim 1, wherein a portion of the metal material is press-fitted into the electrically conductive resin material.

3. The method according to claim 1, wherein the heating includes applying an electric current to between the metal material and the electrically conductive resin material.

4. The method according to claim 1, wherein the heating includes vibrating the metal material and the electrically conductive resin material at high speed.

5. The method according to claim 1, wherein a metal film is formed on a surface of the connecting portion of the metal material, the metal film having a melting point lower than the melting point of the metal material, said heating involving heating the metal film.

6. The method according to claim 1, wherein a portion of the metal material is embedded in the electrically conductive resin material.

* * * * *